(12) United States Patent
Love et al.

(10) Patent No.: US 7,754,343 B2
(45) Date of Patent: Jul. 13, 2010

(54) TERNARY ALLOY COLUMN GRID ARRAY

(75) Inventors: David Love, Pleasanton, CA (US); Bidyut Sen, Milpitas, CA (US)

(73) Assignee: Oracle America, Inc., Redwood City, CA (US)

( * ) Notice: Subject to any disclaimer, the term of this patent is extended or adjusted under 35 U.S.C. 154(b) by 1092 days.

(21) Appl. No.: 11/315,818

(22) Filed: Dec. 21, 2005

(65) Prior Publication Data

US 2007/0042211 A1 Feb. 22, 2007

Related U.S. Application Data

(60) Provisional application No. 60/708,837, filed on Aug. 17, 2005.

(51) Int. Cl.
| | |
|---|---|
| B23K 35/22 | (2006.01) |
| H01L 23/48 | (2006.01) |
| B22F 7/02 | (2006.01) |
| B32B 3/00 | (2006.01) |

(52) U.S. Cl. ...................... 428/646; 428/610; 428/673; 428/674; 228/180.22; 228/180.21; 228/56.3; 257/772; 257/E23.023; 257/E23.028; 420/560; 420/557

(58) Field of Classification Search ........................ None
See application file for complete search history.

(56) References Cited

U.S. PATENT DOCUMENTS

| | | | |
|---|---|---|---|
| 4,667,871 | A | 5/1987 | Mizuhara |
| 4,695,428 | A | 9/1987 | Ballentine et al. |
| 4,758,407 | A | 7/1988 | Ballentine et al. |
| 4,778,733 | A | 10/1988 | Lubrano et al. |
| 5,102,748 | A | 4/1992 | Wylam et al. |
| 5,324,892 | A | 6/1994 | Granier et al. |

(Continued)

FOREIGN PATENT DOCUMENTS

CA 2389446 A1 * 12/2003

OTHER PUBLICATIONS

Frear, Darrel R., "Materials Issues in Area-Array Microelectronic Packaging," JOM, 51 (3) pp. 22-27, Mar. 1999.

(Continued)

*Primary Examiner*—Aaron Austin
(74) *Attorney, Agent, or Firm*—Gregory P. Durbin; Polsinelli Shughart PC (57) ABSTRACT

Techniques and structures have been developed for providing lead-free column grid array interconnect structures. An exemplary interconnect has a body, a first joint, and a second joint, all having compositions off the eutectic composition in a ternary alloy system, the first joint having a ternary composition distinct from the body composition, and the second joint having a ternary composition distinct from the body composition and the first joint composition. The interconnect may be formed by solidifying a solder, having a Sn-poor ternary composition in the Sn—Ag—Cu alloy system, in contact with a column, having a Ag-rich Cu-deficient composition in the same system, and a bonding pad or bare substrate. A second solder, having a Sn-rich ternary composition, may be solidified in contact with the column and a second bonding pad or bare substrate. In some embodiments joints may be severed and reformed by remelting and resolidifying the lower-liquidus solder.

6 Claims, 5 Drawing Sheets

U.S. PATENT DOCUMENTS

| | | | |
|---|---|---|---|
| 5,435,968 | A | 7/1995 | Panthofer |
| 5,527,628 | A | 6/1996 | Anderson et al. |
| 5,863,493 | A | 1/1999 | Achari et al. |
| 6,429,388 | B1 | 8/2002 | Interrante et al. |
| 6,581,821 | B2 | 6/2003 | Sarkhel |
| 6,854,636 | B2 | 2/2005 | Farooq et al. |
| 6,892,925 | B2 | 5/2005 | Interrante et al. |
| 6,917,113 | B2 | 7/2005 | Farooq et al. |
| 2005/0106059 | A1 | 5/2005 | Farooq et al. |
| 2007/0059548 | A1* | 3/2007 | Love et al. .................. 428/610 |

OTHER PUBLICATIONS

Moon, K-W. et al., "Experimental and Thermodynamic Assessment of Sn—Ag—Cu Solder Alloys," J. Electron. Mater., vol. 29, pp. 1122-1236, 2000.

Costlow, Terry, "NEMI Backs Lead-free Solder Alloy for Standard," EE Times, 2 pp., Jan. 24, 2000.

Kattner, Ursula R., et al., "Calculation of Phase Equilibria in Candidate Solder Alloys," Z. Metallkd., vol. 92, 12 pp., Jul. 2001.

Siewert, Thomas, et al., "Database for Solder Properties with Emphasis on New Lead-free Solders: Properties of Lead-Free-Solders," Release 4.0, 76 pp., Feb. 11, 2002.

IBM Corporation, "Ceramic Column Grid Array Assembly and Rework: User's Guide," 96 pp., Jul. 25, 2002.

Interrante, Mario, et al., "Lead-Free Package Interconnections for Ceramic Grid Arrays," SEMI Int'l Electronics Manufacturing Technology Symposium, pp. 85-92, 2003.

European Parliament and Council, "Directive 2002/96/EC of the European Parliament and of the Council of Jan. 27, 2003 on the restriction of the use of certain hazardous substances in electrical and electronic equipment," Official Journal of the European Union, pp. L 37/19-L 37/23, Feb. 13, 2003.

European Parliament and Council, "Directive 2002/96/EC of the European Parliament and of the Council of Jan. 27, 2003 on waste electrical and electronic equipment (WEEE)," Official Journal of the European Union, pp. L 37/24-L 37/38, Feb. 13, 2003.

Hwang, Jennie S., "Solder Materials: Step 3," Surface Mount Technology (SMT), Mar. 2004.

Handwerker, Carol, "Transitioning to Lead-Free Assemblies," Printed Circuit Design & Manufacture, pp. 17-18 & 23, Mar. 2005.

IPC, "Lead Free: Answers to Your Frequently Asked Questions," IPC Review, vol. 46, No. 4, 3 pp., May 2005.

Cookson Electronics Assembly Materials, "ALPHA® Vaculoy SAC300,305,400,405," Technical Bulletin Issue 2, 4 pp., downloaded May 18, 2005 from http://alphametals.com/products/solder_barwire/pdf/TB%20Vaculoy%20SAC300.305,400,405%20Issue%202.pdf.

National Institute of Standards and Technology, "Ag—Cu Phase Diagram & Computational Thermodynamics," 2 pp., downloaded May 26, 2005 from http://www.metallurgy.nist.gov/phase/solder/agcu.html.

National Institute of Standards and Technology, "Ag—Sn Phase Diagram & Computational Thermodynamics," 3 pp., downloaded May 26, 2005 from http://www.metallurgy.nist.gov/phase/solder/agsn.html.

National Institute of Standards and Technology, "Cu—Sn Phase Diagram & Computational Thermodynamics," 4 pp., downloaded May 26, 2005 from http://www.metallurgy.nist.gov/phase/solder/cusn.html.

National Institute of Standards and Technology, "Ag—Cu—Sn Phase Diagram & Computational Thermodynamics," 4 pp., downloaded May 26, 2005 from http://www.metallurgy.nist.gov/phase/solder/agcusn.html.

National Institute of Standards and Technology, "Pb—Sn Phase Diagram & Computational Thermodynamics," 2 pp., downloaded May 26, 2005 from http://www.metallurgy.nist.gov/phase/solder/pbsn.html.

National Institute of Standards and Technology, "Ag—Bi—Cu Phase Diagram & Computational Thermodynamics," 2 pp., downloaded May 26, 2005 from http://www.metallurgy.nist.gov/phase/solder/agbicu.html.

National Institute of Standards and Technology, "Ag—Bi—Sn Phase Diagram & Computational Thermodynamics," 3 pp., downloaded May 26, 2005 from http://www.metallurgy.nist.gov/phase/solder/agbisn.html.

National Institute of Standards and Technology, "Bi—Cu—Sn Phase Diagram & Computational Thermodynamics," 4 pp., downloaded May 26, 2005 from http://www.metallurgy.nist.gov/phase/solder/bicusn.html.

Indium Corporation of America, "Pb-Free Solder Fabrications," Product Data Sheet, Form No. 97820 R1, 2 pp., downloaded May 26, 2005 from http://www.indium.com/documents/pds/97820.pdf.

\* cited by examiner

TERNARY ALLOY COLUMN GRID ARRAY

CROSS-REFERENCE TO RELATED APPLICATION(S)

This application claims the benefit under 35 U.S.C. § 119(e) of U.S. Provisional Application No. 60/708,837, filed Aug. 17, 2005, entitled "GRID ARRAY PACKAGE USING TIN/SILVER COLUMNS" by David G. Love and Bidyut Sen, which application is hereby incorporated by reference.

BACKGROUND

1. Field of the Invention

This invention relates to the packaging of electronic components using lead-free structures and materials.

2. Description of the Related Art

In the electronics industry, it is often necessary to attach chip packages and bare die to printed circuit boards (PCBs). The attachment structures provide electrical connections as well as mechanical support. Thermal management is also an issue in these systems. Circuit boards are often constructed of organic materials with relatively high coefficients of thermal expansion (CTEs), while ceramic chip carriers have relatively low CTEs. Thermal expansion mismatch can cause mechanical reliability problems such as metal fatigue. For some applications the thermal mismatch can be accommodated more easily using column grid array attachment techniques than using ball grid arrays.

In the past, many attachment structures used lead-containing solders. More recently it has been recognized as important to reduce the quantity of hazardous material used in many industries, including the electronics industry. Solders based on alloys of tin, silver, and copper have found use as lead-tin substitutes. The system is often referred to as "S-A-C" after the first letters of the chemical symbols for the constituents: Sn (tin)-Ag (silver)-Cu (copper). NEMI has, in fact, promulgated proposed standard solder formulations, including binary compositions of 0.7% Cu in Sn and 3.5% Ag in Sn for wave soldering, and a ternary alloy containing 3.9% Ag and 0.6% Cu in Sn for solder reflow. It is customary in this art to cite composition by weight or mass, so that 100 grams of the ternary reflow solder contain 95.5 g Sn, 3.9 g Ag, and 0.6 g Cu. The S-A-C eutectic composition of 95.42% Sn, 3.73% Ag, and 0.85% Cu, as reported by NIST, has a melting point of approximately 216° C.

SUMMARY

Techniques have been developed to provide, in some embodiments, an attachment structure for mechanically and electrically connecting substrates that is robust to differences in coefficients of thermal expansion. In some embodiments the substrates may be electronic packages, including packaged integrated circuits (ICs) and bare die, to be attached to next-level packaging structures. In some embodiments the substrates may be electronic packages to be attached to other electronic packages. In some embodiments the substrates may be printed circuit boards (PCBs) to be attached to other PCBs.

In some embodiments lead-free alloy columns are joined to bonding pads on electronic packages having relatively low coefficients of thermal expansion (CTEs) using Pb-free solder from the same alloy system. In some embodiments Pb-free alloy columns are joined to bonding pads on printed circuit boards (PCBs) having relatively high CTEs using Pb-free solder from the same alloy system. In some embodiments the Pb-free columns soldered at one end to the low-CTE packages and at the other to the high-CTE boards accommodate the thermal expansion mismatch between the packages and boards while providing good electrical contact between the corresponding bonding pads.

Techniques and structures have been developed for providing lead-free column grid array interconnect structures. In some embodiments an interconnect has a body, a first joint, and a second joint, all having compositions off the eutectic composition in a ternary alloy system, the first joint having a ternary composition distinct from the body composition, and the second joint having a ternary composition distinct from the body composition and the first joint composition. In some applications the interconnect may be formed by solidifying a solder, having a Sn-poor ternary composition in the Sn—Ag—Cu alloy system, in contact with a column, having a Ag-rich Cu-deficient composition in the same system, and a bonding pad or bare substrate. A second solder, having a Sn-rich ternary composition, may be solidified in contact with the column and a second bonding pad or bare substrate. In some embodiments joints may be severed and reformed by remelting and resolidifying the lower-liquidus solder.

In some embodiments techniques are provided for joining Pb-free alloy columns to an electronic package using a Pb-free composition from the same alloy system as the column. In some realizations, a method for joining Pb-free alloy columns to a PCB using a Pb-free composition from the same alloy system as the column is provided. In some realizations, a method for joining one end of a Pb-free alloy column to an electronic package and the other end to a PCB using two distinct Pb-free solders from the same alloy system as the column, each solder with a distinct liquidus temperature, is provided. In some embodiments, one of the solders has a liquidus temperature more than 10° C. higher than a eutectic temperature in the ternary alloy system.

In some embodiments, a thermal hierarchy in a Pb-free ternary alloy system is provided. In some embodiments a column is formed from an off-eutectic ternary alloy composition and is attached between an electronic package and a PCB using two distinct solders having off-eutectic compositions in the same ternary alloy system as the column, each solder with a distinct liquidus temperature, both of which are lower than the column liquidus temperature. In some embodiments, the first solder has a liquidus temperature more than 10° C. higher than a eutectic temperature in the ternary alloy system.

In some embodiments, methods are provided for joining an alloy column and a bonding pad using a molten solder. In some embodiments the solder has a ternary composition in the SAC system that is significantly richer in Ag and Cu than a ternary Sn—Ag—Cu eutectic composition, while the column has a composition in the SAC system that is virtually entirely depleted of Cu. In some embodiments, methods are provided for forming a joint between the column and a second bonding pad. In some applications of these techniques, the joint is formed using a second solder with a composition in the SAC system that is significantly poorer in Ag and Cu than a ternary Sn—Ag—Cu eutectic composition. Further techniques are described for reworking the joint between the column and the second bonding pad, for example, by reflowing the second solder. In some applications of these techniques, the column and second bonding pad are repositioned while the second solder is molten, severing the original joint. In some embodiments, the joint may be reformed by solidifying the second solder in contact with the column and the second bonding pad or between the column and a third bonding pad.

The foregoing is a summary and thus contains, by necessity, simplifications, generalizations and omissions of detail. Consequently, those skilled in the art will appreciate that the foregoing summary is illustrative only and that it is not intended to be in any way limiting of the invention. The inventive concepts described herein are contemplated to be used alone or in various combinations. Other aspects, inventive features, and advantages of the present invention, as defined solely by the claims, may be apparent from the detailed description set forth below.

BRIEF DESCRIPTION OF THE DRAWINGS

The present invention may be better understood, and its numerous objects, features, and advantages made apparent to those skilled in the art, by referring to the accompanying drawings.

The use of the same reference symbols in different drawings indicates similar or identical items.

DESCRIPTION OF THE PREFERRED EMBODIMENT(S)

Techniques have been developed to provide, in some embodiments, an advantageous series of lead-free alloy compositions useful in attaching packaged ICs, semiconductor die, and other chip carriers to printed circuit and printed wiring boards. In this context, and acknowledging that it is nearly impossible for electronics to be entirely free of lead, which is fairly ubiquitous in the environment, we apply the term "lead-free" to materials containing less than proposed maximum contaminant levels for compliance with the RoHS Directive and other local, national, and international environmental regulations. Currently these impurity levels (by weight) are 0.1 percent for Pb, Hg, Cr VI, polybrominated biphenyl (PBB), penta-polybrominated diphenyl ether (PBDE) and octa-PBDE, and 0.01 percent for Cd in each homogeneous material. The regulations and guidelines define a "homogeneous material" as a material that cannot be mechanically disjointed into different materials.

A ternary alloy system includes end members and binary compositions, in addition to ternary compositions. Using the SAC system as an example, pure Sn, pure Ag, and pure Cu may be said to be members of the system. Alloys, however, contain at least two elements, so that alloy members of a ternary alloy system comprise two or more elements. Binary compositions, such as 20 w/oAg in Sn, in a ternary alloy system contain only two of the three elements in amounts sufficient to alter the properties of the material. Although not present in all alloy systems, intermetallic compounds, e.g., $Ag_3Sn$, $Cu_6Sn_5$, and $Cu_3Sn$, in a ternary alloy system may contain two or three of the constituent elements, in a ratio that has such a small range it is treated as fixed, i.e., the compound is treated as having no variation in composition. Ternary compositions contain all three end members in amounts large enough to affect the properties of the material, that is, in more than trace or contaminant amounts.

The composition of an alloy, i.e. the ratio of its component elements, is an analog quantity in that it is continuously variable in increments determined more by the limits of the tools and techniques used to analyze it than by an absolute scale. Even pure elements and so-called "line compounds" possess non-zero ranges of composition. Nevertheless, in the context of the teaching provided by this disclosure, compositions are said to be "distinct" when certain properties of interest differ between them. In particular, two compositions are distinct when they exhibit liquidus temperatures that differ enough to allow one to retain sufficient structural integrity to function in its role in an interconnect structure at a temperature above the liquidus temperature of the other. Similarly, compositions differ significantly from the eutectic composition when the difference between the composition's liquidus and solidus temperatures can be exploited. By corollary, alloys with small differences in composition but immeasurable or irrelevant differences in properties may not be distinguishable. For example, a ternary alloy may be virtually entirely depleted in one component if that component is present in such small quantities as to have an immeasurable or irrelevant affect on a property of interest, such as liquidus temperature or microstructure. And while alloy compositions may be described as members of a ternary alloy system, useful compositions may comprehend small amounts of additional elements, whether added intentionally or present as unavoidable impurities. No doubt persons of ordinary skill in the art following the teaching herein and in the course of ordinary experimentation will find useful variations on the examples given. Nonetheless, the scope of the invention is to be understood as limited only by the appended claims.

Figure 4A:
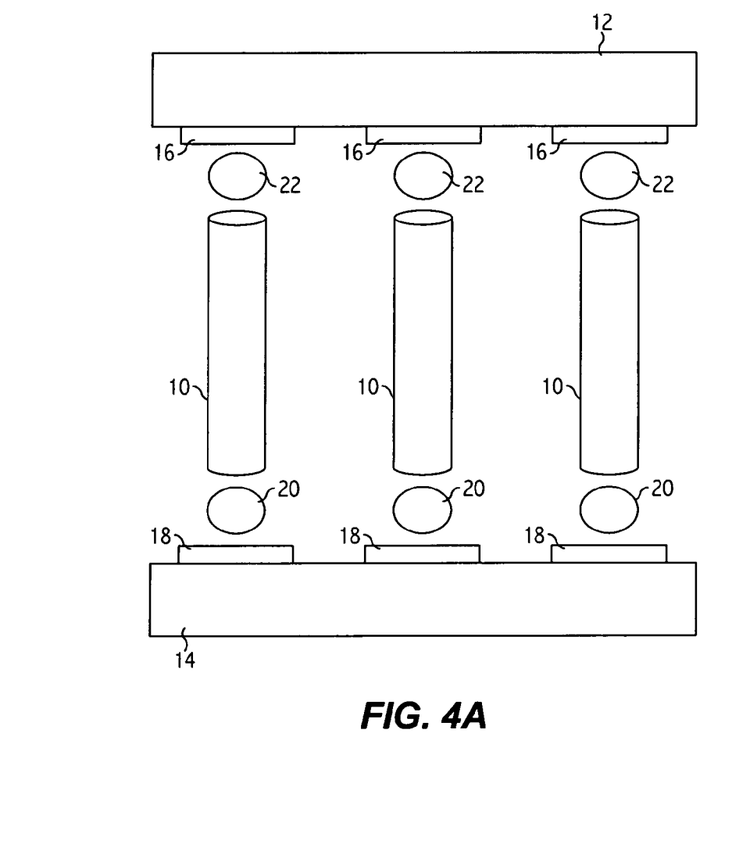
FIGS. 4A-4C depict a printed circuit board in stages of attachment to a chip carrier using an alloy column and two solder compositions comprising elements of a common ternary alloy system.

The drawing figures provided are simplified and, as usual in the art, not to scale, but depict relationships between structural elements. For example, the separation of alloy columns and quantities of solder from other structures as in FIGS. 1A and 4A is not meant to imply that these elements exist unsupported, but rather offers a clarification of the relationship of the individual elements to the finished structure.

EXAMPLE 1

Figure 1A:
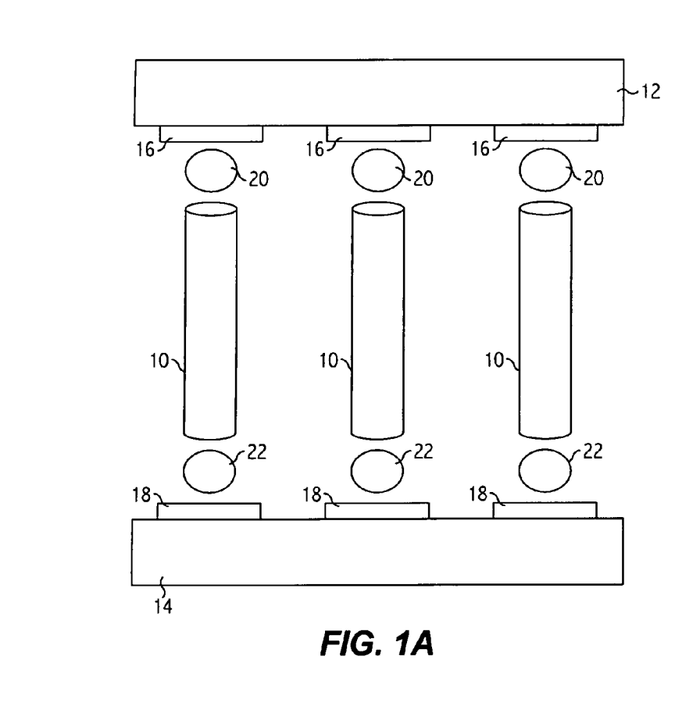
FIGS. 1A-1C depict a chip carrier in stages of attachment to a printed circuit board using an alloy column and two solder compositions comprising elements of a common ternary alloy system.
Figure 1B:
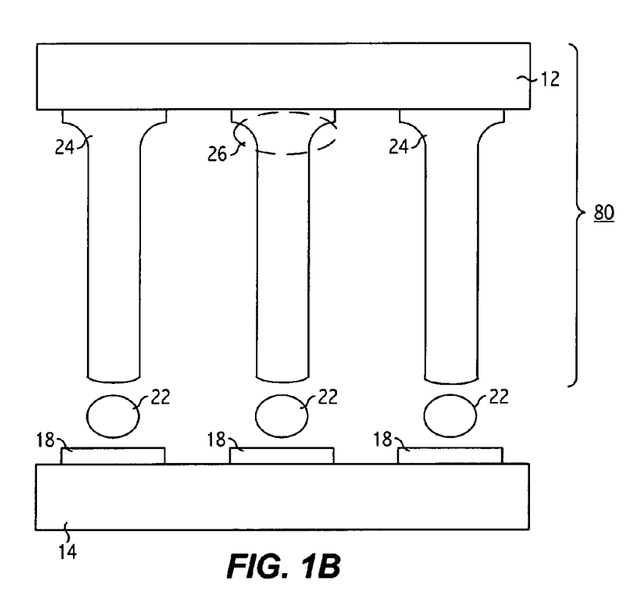
Figure 1C:
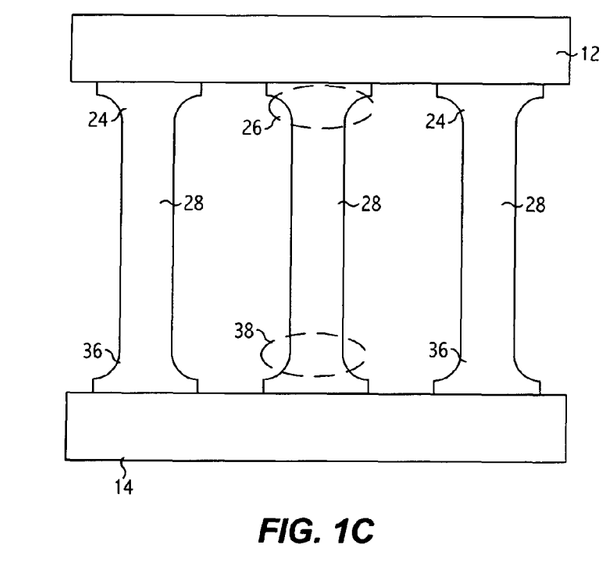

FIG. 1A depicts a chip carrier before attachment to a printed circuit board using an alloy column and two solder compositions comprising elements of a common ternary alloy system. In one preferred embodiment, a column 10 for attaching a chip carrier 12 to a printed circuit board (PCB) 14 is formed from approximately 80 percent by weight (80 w/o) tin and 20 w/o silver. This composition has a liquidus temperature of approximately 380-385° C. and a solidus temperature of approximately 230° C. The column 10 may be formed by any suitable method. For example, column 10 may be cast or cut from wire or ribbon, using any of the techniques standard in the solder industry. One end of the column is to be attached to the chip carrier 12 with a quantity of solder 20 and the other end to the PCB 14 with a quantity of solder 22. Generally both chip carriers and PCBs have solderable bonding pads 16, 18 for attaching one to the other and allowing for input and output operations. Often the bonding, or I/O, pads have a high copper or nickel content. Referring to FIG. 1B, the alloy column 10 is attached to a bonding pad 16 on the chip carrier using a solder 20 to form a joint 24, whose structure 26 is described in more detail with reference to FIG. 2A. The solder 20 in this example has a composition of approximately 91 w/o tin, 7 w/o silver, and 2 w/o copper, having a liquidus temperature of approximately 272° C. and a solidus temperature of approximately 216° C. Referring to FIG. 1C, the other end of the alloy column 10 is then attached to a bonding pad 18 on the PCB 14 using a solder 22 to form a joint 36, whose structure 38 is described in more detail with reference to FIG. 2B. The solder 22 in this example has a composition of approximately 96.5 w/o tin, 3.0 w/o silver, and 0.5 w/o copper, having a liquidus temperature of approximately 220° C. and a solidus temperature of approximately 216° C.

During the first soldering procedure, the molten solder 20 attains a temperature higher than its liquidus, but below the liquidus temperature of the alloy column 10. Heating the solder thus causes it to flow. The tip of the column 10 in contact with the molten solder 20 softens and mixing occurs locally. Copper from the solder 20 and, when present, the bonding pad 16, suppresses the solidus temperature of the tip of the column to the Sn—Ag—Cu eutectic temperature of approximately 216° C. As the solder joint 24 cools, a composition gradient develops from the 80-20 of the original column alloy through the 91-7-2 of the original high-temperature solder composition. Should the bonding pad 16 contain copper and/or silver, the pad also partially alloys with the solder resulting in another composition gradient. When the solder joint 24 cools below the Sn—Ag—Cu eutectic temperature, solidification is complete. The resulting joint structure 26, shown in FIG. 2A, has smooth transitions between the column 28, solder fillet 24, and bonding pad 16. A beta-Sn matrix 30 surrounds intermetallic phases 32, 34, that vary in local density as the composition changes.

During the second soldering procedure, the molten solder 22 attains a temperature higher than its liquidus, but below the liquidus temperature of both the alloy column 10 and the first solder junction 24. The tip of the column 10 in contact with the molten solder 22 softens and mixing occurs locally. Copper from the solder 22 and, when present, the bonding pad 18, suppresses the solidus temperature of the tip of the column 10 to the Sn—Ag—Cu eutectic temperature of approximately 216° C. As the solder joint 36 cools, a composition gradient develops from the 80-20 of the original column alloy through the 96.5-3.0-0.5 of the original lower-temperature solder composition. Should the bonding pad 18 contain copper and/or silver, it also partially alloys with the solder resulting in another composition gradient. When the solder joint 36 cools below the Sn—Ag—Cu eutectic temperature, solidification is complete. The resulting joint structure 38, shown in FIG. 2B, has smooth transitions between the column 28, solder fillet 36, and bonding pad 18. A beta-Sn matrix 40 surrounds intermetallic phases 32, 34, that vary in local density as the composition changes. Should rework be required, the chip carrier 12 and attached columns 28 can be removed from the PCB 14 by reflowing at a temperature well below the liquidus of the first solder junction 24, allowing the columns 28 to remain attached to the chip carrier 12.

In the completed structure of FIG. 1C, the column-and-solder attachment structure provides an electrically conducting path between the PCB 14 and the chip carrier 12. The attachment structure also provides mechanical support for the chip carrier. Differential expansion and contraction between the PCB 14 and the chip carrier 12 is accommodated by the attachment structure, which can bend without plastic deformation at a much higher strain level than a ball grid array (BGA) solder joint.

Figure 2A:
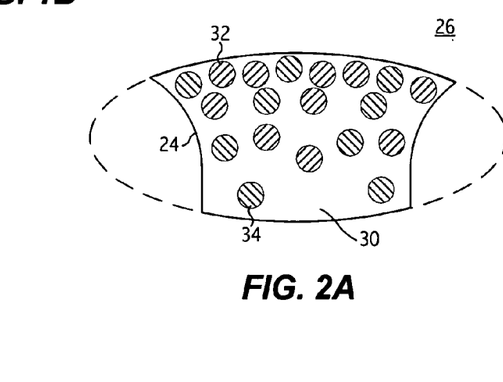
FIGS. 2A and 2B depict enlargements of solder joints as depicted in FIGS. 1B and 1C.
Figure 2B:
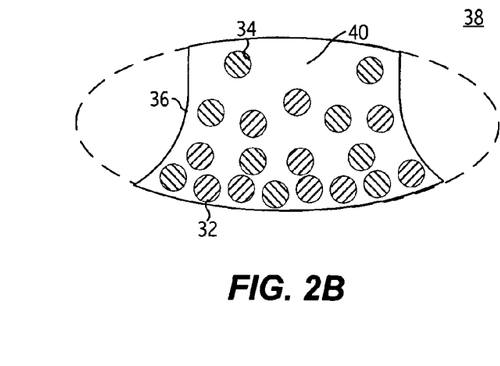

FIGS. 2A and 2B show greatly simplified versions of the microstructures of joints 26 and 38, respectively. The intermetallic compound $Ag_3Sn$ tends to form platelets while $Cu_5Sn_6$ is more dendritic. Thus copper-rich intermetallic phase 32 has different morphology from silver-rich intermetallic phase 34. This use of ternary compositions for the solder materials in a thermal hierarchy allows for a greater degree of property tailoring than does the use of binary solders. For example, given a desired liquidus temperature, composition of the solder material may be chosen from the range having that liquidus temperature so as to optimize the ratio of constituent phases and adjust the morphology of the resulting joint. The SAC system is used merely as an example here; other ternary alloy systems form other intermetallic compounds and exhibit other morphologies.

Figure 3A:
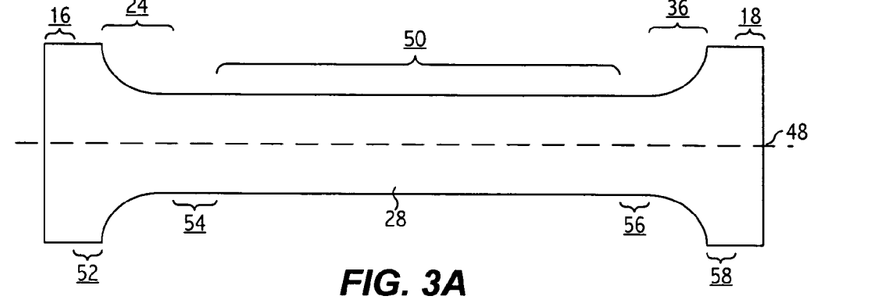
FIGS. 3A-3C depict an electrical interconnection structure and its compositional variation.

Joined alloy column 28 of FIG. 1C is reproduced in FIG. 3A. At each end of the column 28 are the parts of the original bonding pads 16, 18 left unaffected by the first and second soldering procedures, respectively. At the center of the column 28 is a region unaffected by either of the soldering processes, referred to hereafter as the body 50 of the column. The body 50 need not be symmetrically located with respect to the two solder joints 26 and 32. During soldering, transition regions form between relatively unaffected regions of the attachment structure. During the first soldering operation, transition region 52 forms between the bonding pad 16 and the high-temperature solder joint 26, while transition region 54 forms between the high-temperature solder joint 26 and the body 50 of the column. During the second soldering operation, transition region 56 forms between the low-temperature solder joint 36 and the body 50 of the column, while transition region 58 forms between the bonding pad 18 and the low-temperature solder joint 36.

Figure 3B:
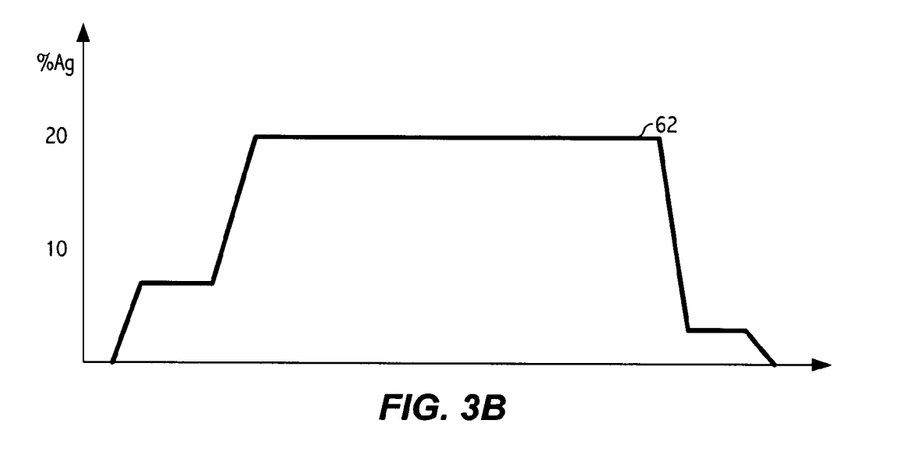
Figure 3C:
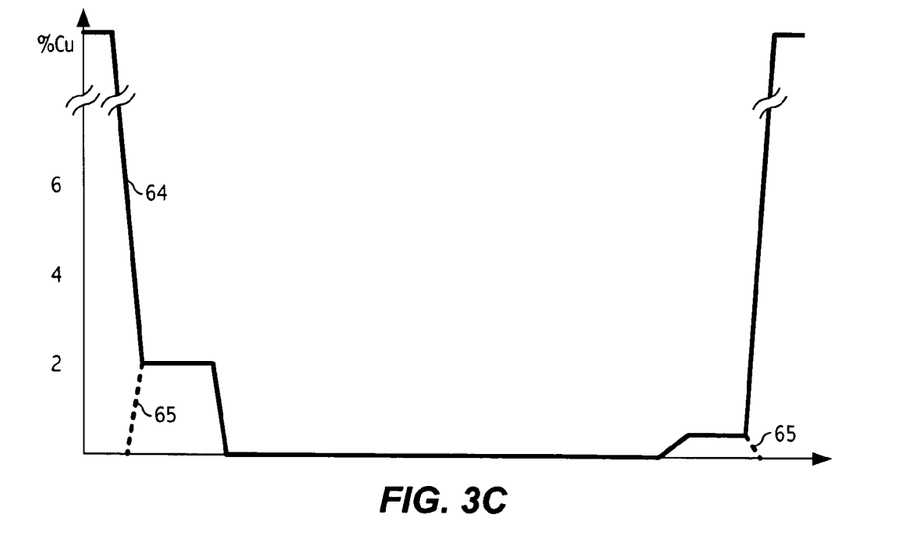

FIGS. 3B and 3C depict typical Ag 62 and Cu 64 concentrations, respectively, found along the centerline 48 of joined alloy column 28 of FIG. 3A. These figures are, again, greatly simplified and are intended to facilitate explanation of the invention rather than to faithfully reproduce a particular concentration measurement. The two concentration scales are different and, for specificity, the bonding pads in this example are taken to contain virtually no silver and a high concentration of copper, indicated in FIG. 3C by the parallel lines breaking the Cu concentration line 64. As shown in FIG. 3B, the Ag concentration 62 goes from virtually zero in bonding pad 16, through a smooth transition to the nominal composition of 7 w/o of the higher-temperature solder within the joint 24, through a second transition to a peak value of 20 w/o in the body 50 of the alloy column, through another transition to the nominal composition of 3.0 w/o of the lower-temperature solder within the joint 36, and through a final transition, dropping to undetectable levels in the bonding pad 18. FIG. 3C shows that the concentration 64 of Cu starts out very high in bonding pad 16, through a smooth transition to the nominal composition of 2 w/o of the higher-temperature solder within the joint 24, through a second transition to a minimum value of approximately zero in the body 50 of the alloy column, through another transition to the nominal composition of 0.5 w/o of the lower-temperature solder within the joint 36, and through a final transition, reaching the very high concentration of the bonding pad material 18. If the bonding pad 16 is made of nickel or another solderable metal, the copper concentration drops to virtually zero in the pad, as shown by dotted line 65. The smooth variation of composition throughout the length of the attachment structure provides cohesion under conditions of thermal and mechanical stress.

EXAMPLE 2

Figure 4B:
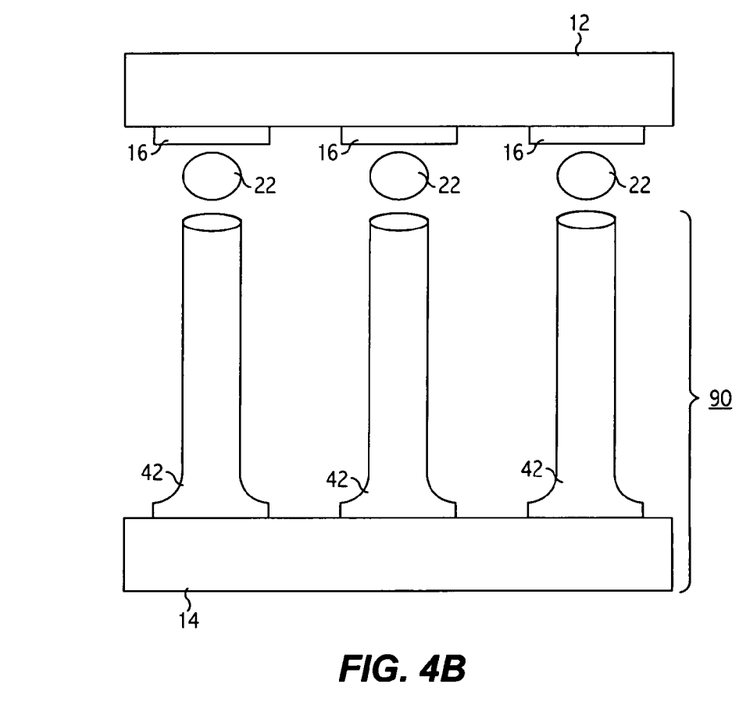

FIG. 4A depicts a chip carrier before attachment to a printed circuit board using an alloy column and two solder compositions comprising elements of a common ternary alloy system. The column 10 for attaching a chip carrier 12 to a printed circuit board (PCB) 14 is formed from an alloy of Ag in Sn with a composition higher in Ag than the Sn—Ag eutectic composition, having a liquidus temperature above about 300° C. Referring to FIG. 4B, one end of the alloy column 10 is attached to a bonding pad 18 on the PCB using a solder 20 with a composition significantly richer in both silver and copper than the SAC eutectic composition and having a liquidus temperature greater than approximately 240° C. and a solidus temperature of approximately 216° C., forming a high-temperature solder joint 42. To accomplish the attachment, the column 10 is aligned to a bonding pad 18, solder 20 is applied to the bonding pad 18, the column 10, or both, and the solder 20 is heated to a temperature above its solidus temperature. Several methods of aligning attachment columns to bonding pads and between chip carriers and PCBs are known in the art. After bonding, the system cools below the solidus temperature of the solder forming the solder joint 42.

Figure 4C:
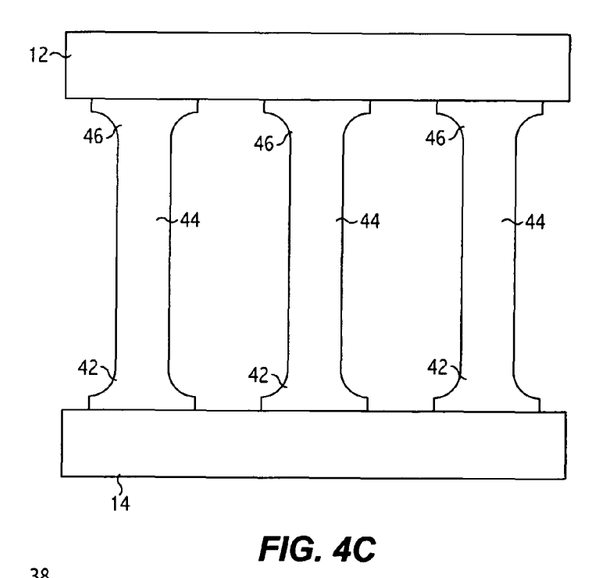

As depicted in FIG. 4C, the other end of the alloy column 10 is then attached to a bonding pad 16 on the chip carrier 12 using a solder 22 with a composition significantly poorer in both silver and copper than the SAC eutectic composition and having a liquidus temperature less than approximately 232° C. and a solidus temperature of approximately 216° C., forming a lower-temperature solder joint 46, as described with reference to solder joint 42. Should rework be required, the chip carrier 12 can be removed from the PCB 14 and attached columns 44 by reflowing at a temperature well below the liquidus of the first solder junction 42, allowing the columns 44 to remain attached to the PCB 14.

EXAMPLE 3

Figure 5A:
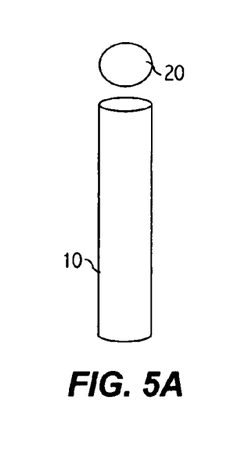
FIGS. 5A and 5B depict an alloy column and a quantity of solder before and after, respectively, attachment.
Figure 5B:
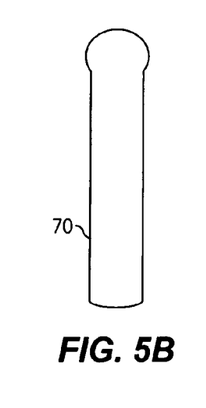
Figure 6:
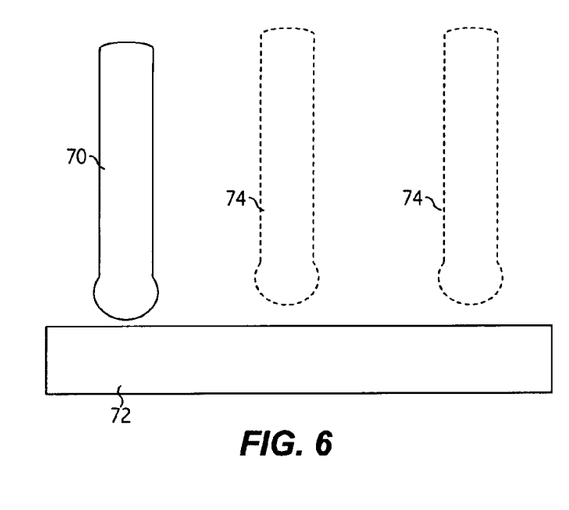
FIG. 6 depicts an alloy column preform prior to attachment to a substrate.
Figure 7:
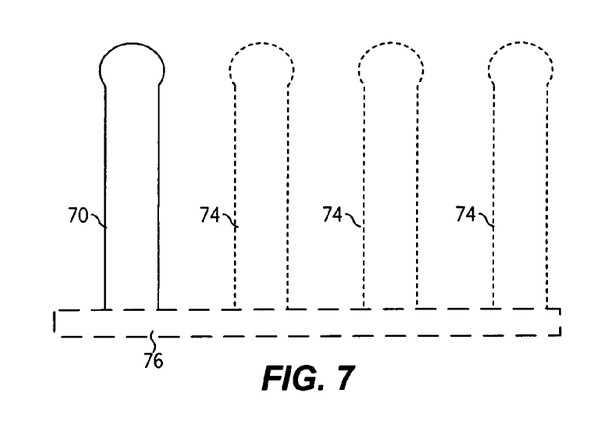
FIG. 7 depicts an alloy column preform supported by a tape.

Alloy columns may be prepared for use by attaching the relatively high liquidus solder to one end of the column. Referring to FIG. 5A, the solder 20 can be attached to the alloy column 10, producing a column preform 70, shown in FIG. 5B. As shown in FIG. 6, the preform 70 can then be placed so the solder makes contact with a substrate 72, such as a PCB or a chip carrier, and the solder can be flowed to attach the column to the substrate. Additional preforms 74 may optionally be attached during the same or a subsequent bonding operation. FIG. 7 depicts a preform 70 attached to a tape 76 for use in tape automated bonding. The tape 76 may support many additional preforms 74.

OTHER EMBODIMENTS

Alloy columns may be attached to substrates by putting a quantity of solder on the substrate (or bonding pad, if present), flowing the solder, contacting the molten solder with the column, and cooling the structure below the liquidus temperature of the solder and the solidus temperature of the column. The columns may also be attached by putting the solder first on the column, as described in Example 3, or by putting solder on both the column and the substrate, and then flowing the solder, contacting both column and substrate to the molten solder, and cooling the structure. If desired, the lower-temperature soldering process may be performed just subsequent to the completion of the higher-temperature soldering operation. Temperature ranges for soldering operations are chosen to avoid decomposition of the chip carriers and PCBs, and so depend on the materials employed. Cooling rates are also materials dependent, as excess thermal shock to the chip carriers and PCBs must be avoided.

In some realizations of these techniques it may be desirable to provide the attachment structure in parts, for subsequent joining. For example, lead-free alloy columns may first be attached to chip carriers using a relatively high-liquidus temperature solder from the same ternary alloy system as the column, forming subassembly 80 of FIG. 1B. The chip carriers, with attached columns, can then be bonded at a later time to a PCB, or other next-level structure, using a lower-liquidus temperature solder from the same ternary alloy system as the column and the first solder. In another embodiment, lead-free alloy columns may first be attached to a PCB or other attachment structure using a relatively high-liquidus temperature solder from the same ternary alloy system as the column, forming subassembly 90 of FIG. 4B. The PCB, with attached columns, can then be bonded at a later time to chip carrier(s) using a lower-liquidus temperature solder from the same ternary alloy system as the column and the first solder.

As mentioned elsewhere in this description, the compositions of the ternary solders, and, indeed, of the alloy column, can be chosen to provide a desired liquidus temperature. In some applications, the liquidus temperature itself may be an important parameter, such as when the highest temperature soldering operation must be accomplished at a low enough temperature than another element in the system does not degrade. In some applications the absolute difference between the liquidus temperatures of the alloy column and the ternary solders may be an important factor that drives the choice of compositions, as when the temperature of the soldering operations can be controlled only within a range of temperatures. In such a case, the compositions of the solder materials may be chosen to provide liquidus temperature differences greater than any fluctuation in temperature expected during soldering, for example, 5° C., 10° C., or even more depending on the soldering apparatus. In some applications the difference between the liquidus temperature of a solder and the eutectic temperature of the ternary alloy system may be an important parameter in the determination of optimal compositions. While solder compositions with the same, or nearly the same, liquidus temperatures may be successfully employed in joining chip carriers and PCBs, particularly when a relatively high-melting alloy column is used, rework is generally facilitated when the individual elements in the attachment structure have liquidus temperatures separated by several degrees.

In some embodiments, Cu may be added to the Sn/Ag alloy column. Addition of Cu improves tensile strength. In fact, near the 80-20 composition, the liquidus temperature of the alloy is relatively insensitive to small variations in composition as well as to additions of small amounts of copper. In some embodiments, the silver content of the column may be increased to as much as 50 w/o, or higher. Higher concentrations of Ag increase the liquidus temperature of the alloy, increasing the amount of solid phase present at a given temperature as well as the difference between the liquidus temperatures of the column and solder compositions. The attach point, or solder, compositions may also be varied somewhat as long as the compositions retain distinct liquidus temperatures, both lower than the liquidus temperature of the alloy column employed. Additional elements, such as In, Ga, Sb, and Bi, may be added to the SAC system without departing from the scope of the invention.

Other lead-free ternary alloy systems may be employed in addition to the Sn—Ag—Cu system. For example, the bismuth-silver-copper system has a eutectic temperature of about 262° C. and the bismuth-silver-tin system has a Bi-rich eutectic temperature of about 262° C. These systems may be employed for use at higher temperatures. The relatively Sn-rich compositions of the Bi—Ag—Sn ternary alloy system have a eutectic temperature of about 137° C., while the Bi—Cu—Sn system has a eutectic temperature of about 139° C. These systems may be employed for use at lower, even cryogenic, temperatures. Other examples of lead-free ternary alloy systems may include Sn—In—Ga, Sn—In—Sb, Sn—In—Bi, Sn—Ga—Sb, Sn—Ga—Bi, and Sn—Sb—Bi.

While the singular has generally been used for ease of description it should be understood that the invention, as limited only by the appended claims, encompasses plural instances and operations as well. For example, tapes of many alloy column preforms may be prepared and bonded at once to a substrate. Many columns may be attached to a substrate in a single operation. Many substrates may be attached to a common substrate using the alloy column and solder hierarchy in a single operation or serially.

What is claimed is:

1. A Pb-free electrical interconnect structure comprising:
   a body having a composition off an eutectic composition in a ternary alloy system, the ternary alloy system comprising the Sn—Ag—Cu system;
   a first joint having a ternary composition off the eutectic in the ternary alloy system, the first joint composition being distinct from the body composition; and
   a second joint having a ternary composition off the eutectic in the ternary alloy system, the second joint composition being distinct from the body composition and the first joint composition,
   wherein a composition of the interconnect structure varies smoothly from the first joint composition to the body composition and from the body composition to the second joint composition, said varying smoothly comprising a composition gradient of at least a constituent of the ternary alloy system and wherein the composition of the body is significantly richer in Ag than a binary Sn—Ag eutectic composition and comprises substantially no Cu, the ternary composition of the first joint is significantly richer in Ag and Cu than a ternary Sn—Ag—Cu eutectic composition, and the ternary composition of the second joint is significantly poorer in Aq and Cu than a ternary Sn—Aq—Cu eutectic composition.

2. The structure of claim 1, wherein the first joint composition has a liquidus temperature more than 10° C. higher than a eutectic temperature in the ternary alloy system and lower than a liquidus temperature of the body composition.

3. The structure of claim 2, wherein the second joint composition has a liquidus temperature lower than the liquidus temperature of the first joint composition.

4. The structure of claim 1, further comprising a substrate attached to the first joint.

5. The structure of claim 1, further comprising a substrate attached to the second joint.

6. The structure of claim 1, wherein the composition of the body is 80 percent by weight Sn and 20 percent by weight Ag, the ternary composition of the first joint is 91 percent by weight Sn, 7 percent by weight Ag, and 2 percent by weight Cu, and the ternary composition of the second joint is 96.5 percent by weight Sn, 3 percent by weight Ag, and 0.5 percent by weight Cu.

* * * * *